US010852478B1

(12) United States Patent
Prosyk et al.

(10) Patent No.: US 10,852,478 B1
(45) Date of Patent: Dec. 1, 2020

(54) MONOLITHICALLY INTEGRATED GAIN ELEMENT

(71) Applicant: Ciena Corporation, Hanover, MD (US)

(72) Inventors: Kelvin Prosyk, Luskville (CA); Ian Woods, Nepean (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/423,846

(22) Filed: May 28, 2019

(51) Int. Cl.
G02B 6/122 (2006.01)
G02B 6/136 (2006.01)

(52) U.S. Cl.
CPC ........... *G02B 6/1228* (2013.01); *G02B 6/136* (2013.01)

(58) Field of Classification Search
CPC ............................. G02B 6/1228; G02B 6/136
See application file for complete search history.

(56) References Cited

U.S. PATENT DOCUMENTS

| 4,928,285 | A | * | 5/1990 | Kushibe | ................... | H01S 5/16 |
| | | | | | | 372/45.01 |
| 5,799,119 | A | | 8/1998 | Rolland et al. | | |
| 6,058,226 | A | | 5/2000 | Starodubov | | |
| 6,122,416 | A | | 9/2000 | Ooba et al. | | |
| 6,198,854 | B1 | | 3/2001 | Takagi | | |
| 6,411,764 | B1 | | 6/2002 | Lee | | |
| 6,421,492 | B1 | * | 7/2002 | Weber | ................... | G02B 6/1228 |
| | | | | | | 385/131 |
| 6,650,458 | B1 | | 11/2003 | Prosyk et al. | | |
| 6,654,534 | B1 | | 11/2003 | Prosyk et al. | | |
| 6,717,708 | B2 | | 4/2004 | Prosyk | | |
| 7,035,305 | B2 | | 4/2006 | Adams et al. | | |
| 7,184,207 | B1 | | 2/2007 | Walker et al. | | |
| 7,542,201 | B2 | * | 6/2009 | Tanaka | ................... | B82Y 20/00 |
| | | | | | | 359/344 |
| 7,859,745 | B2 | * | 12/2010 | Tanaka | ................... | B82Y 20/00 |
| | | | | | | 359/344 |

(Continued)

FOREIGN PATENT DOCUMENTS

| JP | 2000101186 A | 4/2000 |
| JP | 2001174658 A | 6/2001 |

(Continued)

OTHER PUBLICATIONS

I. Betty et al., An Empirical Model for High Yield Manufacturing of IOGb/s Negative Chirp InP Mach-Zehnder Modulators, OFC, Mar. 2005, 3 pages, vol. 3, Canada.

(Continued)

*Primary Examiner* — Ryan A Lepisto
(74) *Attorney, Agent, or Firm* — Clements Bernard Walker; Lawrence A. Baratta, Jr.; Christopher L. Bernard

(57) ABSTRACT

A photonic integrated circuit including a photonic device and a gain element, said gain element formed by a process including: depositing by epitaxy a first doped layer onto a substrate; depositing by epitaxy an active layer capable of optical gain onto the first doped layer; depositing by epitaxy a second doped layer onto the active layer; pattern etching at least the second doped layer and the active layer to form a first ridge; and depositing by epitaxy a current blocking layer laterally adjacent to the first ridge at least partially filling the volume of active layer that was removed by the pattern etching; wherein the current blocking layer forms a portion of the photonic device.

19 Claims, 7 Drawing Sheets

(56) References Cited

U.S. PATENT DOCUMENTS

| | | | |
|---|---|---|---|
| 7,920,322 B2* | 4/2011 | Oh | G02B 6/1228 257/14 |
| 8,179,592 B2* | 5/2012 | Tanaka | B82Y 20/00 359/344 |
| 8,280,201 B2 | 10/2012 | Prosyk | |
| 8,472,109 B2* | 6/2013 | Tanaka | H01S 5/50 359/344 |
| 8,804,232 B2* | 8/2014 | Kim | H01S 5/1028 359/344 |
| 8,903,202 B1 | 12/2014 | Prosyk et al. | |
| 8,917,958 B2 | 12/2014 | Prosyk | |
| 9,008,469 B2 | 4/2015 | Prosyk | |
| 9,069,223 B2 | 6/2015 | Prosyk | |
| 9,182,546 B2 | 11/2015 | Prosyk et al. | |
| 9,244,327 B2 | 1/2016 | Prosyk | |
| 9,482,925 B2 | 11/2016 | Prosyk et al. | |
| 9,804,425 B1 | 10/2017 | Prosyk | |
| 2002/0038900 A1 | 4/2002 | Yamauchi | |
| 2002/0141682 A1* | 10/2002 | Ryu | G02B 6/1228 385/14 |
| 2003/0081900 A1 | 5/2003 | Nashimoto | |
| 2003/0081922 A1 | 5/2003 | Ide | |
| 2003/0143769 A1 | 7/2003 | Baek et al. | |
| 2005/0095012 A1 | 5/2005 | Watanabe | |
| 2005/0135733 A1 | 6/2005 | Reid et al. | |
| 2005/0169342 A1 | 8/2005 | Glew et al. | |
| 2005/0201437 A1 | 9/2005 | Reid et al. | |
| 2006/0159133 A1* | 7/2006 | Hwang | H01S 5/227 372/19 |
| 2007/0223543 A1 | 9/2007 | Prosyk et al. | |
| 2008/0008416 A1 | 1/2008 | Prosyk et al. | |
| 2011/0134513 A1* | 6/2011 | Kim | G02B 6/1228 359/344 |
| 2011/0305255 A1 | 12/2011 | Ishimura et al. | |
| 2014/0056556 A1 | 2/2014 | Sasahata et al. | |

FOREIGN PATENT DOCUMENTS

| | | |
|---|---|---|
| JP | 2002107681 A | 4/2002 |
| WO | 2007036702 A1 | 4/2007 |

OTHER PUBLICATIONS

H. N. Klein et al., 1.55μm Mach-Zehnder Modulators on InP for optical 40/80 Gbit/s transmission networks, InP and Related Materials Conference, May 2006, pp. 171-173.

R. A Griffin et al., Compact, High Power, MQW InP Mach-Zehnder Transmitters with Fullband Tunability for 10 Gb/s DWDM, ECOC, Sep. 2005, pp. 903-904, vol. 4, Canada.

D. Hoffmann et al., 45 Ghz Bandwidth Travelling Wave Electrode Machzehnder Modulator With Integrated Spot Size Converter, 2004 International Conference on Indium Phoshide and Related Materials Conference Proceedings, May 2004, pp. 585-588.

K. Prosyk et al., Low Loss, Low Chirp, Low Voltage, Polarization Independent 40Gb/s Bulk Electro-Absorption Modulator Module, OFC, Mar. 2003, pp. 269-270, vol. 1, U.S.A.

Chih-Wei Hu et al., High Performance 155 μm InGaAsP Buried-Heteros ructure Laser Diodes Fabricated by Single-Step MOCVD Regrowth and Self-Aligned Technique, ECS, Journal of the Electrochemical Society, 154 (4) H263-H267 (2007), pp. 263-267.

Oct. 6, 2020, International Search Report and Written Opinion for International Application No. PCT/US2020/034888.

* cited by examiner

TRANSVERSE

↑

PROPAGATION INTO THE PAGE

→ LATERAL

MONOLITHICALLY INTEGRATED GAIN ELEMENT

TECHNICAL FIELD

The present disclosure relates generally to photonic components for use in optical devices and optical networks. More specifically, the present disclosure relates to a modulator with a monolithically integrated optical amplifier.

BACKGROUND

The various possible configurations of planar optical waveguides used in photonic integrated circuits (PICs) are often broadly sorted into two categories by their strength of lateral guiding: strongly guided and weakly guided. The strength of lateral guiding determines how well the optical mode is confined to the central portion of the waveguide, and determines the minimum radius of curvature that a curved optical waveguide can achieve before the mode becomes unbound and radiates out of the waveguide. As illustrated in FIG. 1A, a waveguide 3 may consist of a core guiding region 5 with an optical index of refraction of Ng and a laterally adjacent cladding region 7 with optical index of refraction of Nc. Strong guiding refers to a large difference between Ng and Nc. For example, in some indium phosphide (InP)-based PICs with strongly-guided waveguides, the guiding core 5 may have an optical index of refraction of Ng=3.54, while the cladding 7 consists of a dielectric material, such as silicon dioxide ($SiO_2$), with an index of Nc=1.5. Conversely, weak guiding refers to designs where the core index Ng is only slightly higher than the cladding index Nc. For example, if an InP-based PIC lateral cladding 7 is fabricated from semiconductor instead of silicon dioxide, the guide section 5 would still have Ng=3.54, but the lateral cladding 7 may have Nc=3.46, forming a weak guide. An alternative weak guiding structure is shown in FIG. 1B. Here, there is no actual index change in the material 7 adjacent to the waveguide core 5, but a centrally located guiding ridge 9 above the core 5 creates an effective index difference in the areas laterally adjacent the guiding core 5. Such weakly guided waveguides 3 are also known as shallow ridge waveguides, and may have an index contrast Ng−Nc of <0.05.

Low-cost, small-size, and high-performance InP-based Mach-Zehnder modulators (MZMs) are widely known in the photonic components industry. In general, it is desirable that such modulators use strongly-guided waveguides, like those in FIG. 1A, with a dielectric cladding 7. Not only do strongly-guided waveguides enable small size through the compact routing of waveguides, they confine the mode to the central portion 5 of the waveguide 3 that provides the optical modulation function, thereby enabling high efficiency.

Modulators of the sort described herein typically mix a continuous wave (CW) optical carrier input, having no data content, with a broadband electrical signal that carries data. The frequency of the CW carrier may be, for example, approximately 193 THz and is typically desired to be as narrowband as possible, for example 100 kHz line width. The bandwidth of the electrical data signal may span, for example, from 500 MHz to 10 GHz, or from 500 MHz to 70 GHz in modern high-capacity telecommunications systems. Depending on the modulation format being used, the bandwidth can provide a data rate of 10 Gbit/s to 400 Gbit/s or more. The data is transmitted as an optical carrier wave at the frequency of the original CW optical carrier input, with a modulation envelope determined by the electrical data signal. The modulators, therefore, perform an up-conversion function from original radio frequency (RF) data baseband to optical frequencies, in order to enable transmission through optical fiber. The modulators often further combine several RF data tributaries that are in an amplitude-modulated format into a more complex combined phase-and-amplitude-modulated format that may give advantages, for example, in the signal to noise ratio (SNR) of the data at the receiving end of the fiber.

Critical to the function of such modulators is the CW optical carrier input. In some applications, the CW optical carrier is provided by an external laser that is coupled through a short length of optical fiber to the modulator input if they are packaged separately, or through a micro-lens or optical guiding system if they are co-packaged. In these applications, the light lost during the coupling and modulation processes is an important performance parameter. If too much of the CW optical carrier light is lost, the up-converted data signal emitted from the modulator will have low power, and is subject to a poor SNR at the receiver. One obvious solution is to use a high-power laser to compensate the losses. However, there are technology limitations to how high the laser power can be, and engineering consequences in terms of power dissipation, performance non-idealities, and cost. Monolithically integrating a semiconductor optical amplifier, or SOA, with the modulator can overcome these problems.

In other applications, it is preferable to monolithically integrate the laser itself with the modulator, thereby avoiding optical coupling losses, packaging complexity, and cost associated with an external solution. Of course, laser integration could also be combined with an integrated SOA to further boost the optical output power. Lasers and SOAs can be referred to generally as active or gain elements. Whether it is a laser or SOA, the state of the art in lateral optical guiding means is essentially similar. Often with such integration comes the need to integrate photonic components other than a modulator, laser, or SOA: detectors, optical monitors, phase tuning elements, variable optical attenuators, and so on. The extension of this invention to the integration of a gain element (laser or SOA) with photonic components other than a modulator is thus fundamentally important.

Known shallow ridge, or stripe, lasers and SOAs have a configuration similar to FIG. 1B. In addition to being weakly guided, they lack lateral current confinement capability, such that current spreads non-uniformly and inefficiently over a large area, thereby reducing gain.

Known plain deep ridge lasers and SOAs, similar to FIG. 1A, with a lateral cladding 7 of dielectric, as in most modulators, are almost never used, as the etched sidewall of the guiding core 5 leaves dangling chemical bonds that act as mid-level traps. These mid-level traps add a significant non-radiative component to the associated carrier recombination, making the current-gain curve highly unfavorable. Properly preparing the sidewall with chemical treatment and overgrowing it with semiconductor can remove these dangling chemical bonds.

Known buried heterostructure (BH) laser and SOA structures come in numerous variants and represent the current industry standard, utilizing a more sophisticated arrangement of current-blocking layers to achieve better current confinement to the multi-quantum well (MQW) core. One shortcoming is the complex regrowth recipe that is difficult to monolithically integrate with a modulator in a manufacturable manner. Further, BH lasers and SOAs with Al-containing cores are notorious for their questionable reliability. As illustrated in FIG. 2A, the BH structure 15a is manufactured by blanketing the N-InP substrate 10 with a first growth of MQW material 12. A selective etch is then performed to form a MQW ridge. Subsequently, a multi-layer stack 16 is selectively grown around the MQW ridge on the N-InP substrate 10, with sensitive critical dimensions. Finally, an overgrowth of P-type semiconductor 18 is blanketed over the MQW ridge and multi-layer stack 16. Although the current is much better confined, the waveguide is still weakly guided.

Recently, an attempt has been made to simplify the complex arrangement of current-blocking layers of the BH laser by using a self-aligned single-growth technique. The structure exhibits beneficial current confinement. As illustrated in FIG. 2B, the simplified BH structure 15b is manufactured by blanketing the N-InP substrate 10 with a first growth of MQW 12 and P-type semiconductor 18 material. A selective etch is performed to form an MQW ridge. Subsequently, a single, blanket layer of undoped InP 17 is grown over the structure 15b. The undoped InP 17 is removed from the ridge top using a self-aligned etch technique. Like the more complex BH structure 15a (FIG. 2A), this simplified BH structure 15b (FIG. 2B) has good current confinement but is still weakly guided.

Neither the shallow ridge structure (FIG. 1B) nor the BH structure (FIG. 2B) can be directly optically coupled to a modulator because the waveguides are incompatible. Some interconnection means is necessary to bridge the strongly guided and weakly guided waveguides, such as that provided in U.S. Pat. No. 7,184,207, for example.

Thus, what are still needed in the art are structures and processes that enable reliable, manufacturable modulators monolithically integrated with lasers and optical amplifiers having well confined current injection.

SUMMARY

In various exemplary embodiments, the present disclosure provides a design whereby an optical amplifier is efficiently monolithically integrated with a deeply-etched ridge waveguide modulator, and, in particular, a multi-growth modulator formed on an InP substrate, such as that provided in U.S. Pat. No. 9,182,546, for example. The design enables the re-use of existing undoped overgrowth in the TWE modulator for the purpose of current blocking. Subsequent deep etching of the current-blocked buried ridge provides for independent control of the confinement factor and enables efficient coupling to a deeply-etched modulator.

Thus, the present disclosure provides a means to re-use an overgrowth that already exists in the standard modulator process sequence, thereby reducing cost, complexity, and problems associated with many epitaxial growths, such as reliability issues. The present disclosure provides better current confinement, and therefore better electrical efficiency, than alternative shallow ridge solutions. The present disclosure decouples current confinement (provided by u-InP blocks described in greater detail herein below) from optical confinement (provided by etched areas described in greater detail herein below). Accordingly, the present disclosure provides an efficient alternative means to couple light from the modulator to the gain section without introducing an additional or new optical element into the design, such as that provided in U.S. Pat. No. 7,184,207, for example.

The present disclosure provides a modulator with an optical amplifier, including: an N-type layer; a multi-quantum well material disposed on the N-type layer; a P-type layer disposed on the multi-quantum well material opposite the N-type layer; wherein a portion of the N-type layer, the multi-quantum well material, and a portion of the P-type layer collectively form a ridge structure; and a material that is not intentionally doped (undoped, or u-type) disposed on the N-type layer and about side portions of the ridge structure using selective area epitaxy. Optionally, the u-type material is further deeply etched to form a strongly guided structure. The N-type layer includes N-InP. The P-type layer includes one of P-InGaAs and P-InP. The u-type material includes u-InP, but may alternatively be any type of suitable current-blocking material that impedes current flow, such as semi-insulating iron-doped InP. Optionally, over all or some portion of the length, a width of the strongly guided structure is selected to couple efficiently to a strongly guided modulator waveguide.

In one exemplary embodiment, the present disclosure provides a photonic integrated circuit including a photonic device and a gain element, said gain element formed by a process including: depositing by epitaxy a first doped layer onto a substrate; depositing by epitaxy an active layer capable of optical gain onto the first doped layer; depositing by epitaxy a second doped layer onto the active layer; pattern etching at least the second doped layer and the active layer to form a first ridge; and depositing by epitaxy a current blocking layer laterally adjacent to the first ridge at least partially filling the volume of active layer that was removed by the pattern etching; wherein the current blocking layer forms a portion of the photonic device. Optionally, the photonic integrated circuit further includes a first waveguide having a first length and a first width, formed by a combination of the first ridge and the adjacent second doped layer; and a second waveguide having a second length and a second width contiguous with the first waveguide, formed by selectively etching the current blocking layer. Optionally, the first width is larger than the second width, and wherein the first waveguide is weakly guided and the second waveguide is strongly guided. Optionally, the second width tapers along the second length, providing a transition from weakly guided to strongly guided in the second waveguide. The gain element is optically coupled to the photonic device. Optionally, the photonic integrated circuit further includes a strongly-guided third waveguide contiguous with the second waveguide and having a third width, wherein the third width and second width are selected to provide optimal coupling of light between the second and third waveguides. Optionally, the photonic device is an optical modulator. Optionally, the current blocking layer includes an undoped semiconductor. Optionally, the substrate includes InP. Optionally, any of the first doped layer, the second doped layer, and the current blocking layer is/are made substantially conducting or non-conducting using ion implantation means. Optionally, any of the first doped layer, the second doped layer, and the current blocking layer is/are made substantially conducting or non-conducting using dopant diffusion means. Optionally, the current blocking layer includes multiple sub-layers, each with different dopants. Optionally, the current blocking layer functions as an overclad layer in the photonic device. Optionally, an area of deposition of the current blocking layer is shaped in a zig-zag pattern along one or more edges thereof. Optionally, the current blocking layer includes iron-doped InP.

BRIEF DESCRIPTION OF THE DRAWINGS

The present disclosure is illustrated and described herein with reference to the various drawings, in which like reference numbers are used to denote like assembly components/ method steps, as appropriate, and in which.

DESCRIPTION OF EMBODIMENTS

Again, in various exemplary embodiments, the present disclosure provides a design whereby an optical amplifier is efficiently monolithically integrated with a deeply-etched ridge waveguide modulator, and, in particular, a multi-growth modulator formed on an InP substrate, such as that provided in U.S. Pat. No. 9,182,546, for example. The design enables the re-use of existing undoped overgrowth in the TWE modulator for the purpose of current blocking. Subsequent deep etching of the current-blocked buried ridge provides for independent control of the confinement factor and enables efficient coupling to a deeply-etched modulator.

Thus, the present disclosure provides a means to re-use an overgrowth that already exists in the standard modulator process sequence, thereby reducing cost, complexity, and problems associated with many epitaxial growths, such as reliability issues. The present disclosure provides better current confinement, and therefore better electrical efficiency, than alternative shallow ridge solutions. The present disclosure decouples current confinement (provided by u-InP blocks described in greater detail herein below) from optical confinement (provided by etched areas described in greater detail herein below). Accordingly, the present disclosure provides an efficient alternative means to couple light from the modulator to the gain section without introducing an additional or new optical element into the design, such as that provided in U.S. Pat. No. 7,184,207, for example.

In general, the present disclosure provides a modulator with an optical amplifier, including: an N-type layer; a multi-quantum well material disposed on the N-type layer; a P-type layer disposed on the multi-quantum well material opposite the N-type layer; wherein a portion of the N-type layer, the multi-quantum well material, and a portion of the P-type layer collectively form a ridge structure; and a material that is not intentionally doped (undoped, or u-type) disposed on the N-type layer and about side portions of the ridge structure using selective area epitaxy. Optionally, the u-type material is further deeply etched to form a strongly guided structure. The N-type layer includes N-InP. The P-type layer includes one of P-InGaAs and P-InP. The u-type material includes u-InP, but may alternatively be any type of suitable current-blocking material that impedes current flow, such as semi-insulating iron-doped InP. Optionally, over all or some portion of the length, a width of the strongly guided structure is selected to couple efficiently to a strongly guided modulator waveguide.

Figure 1A:
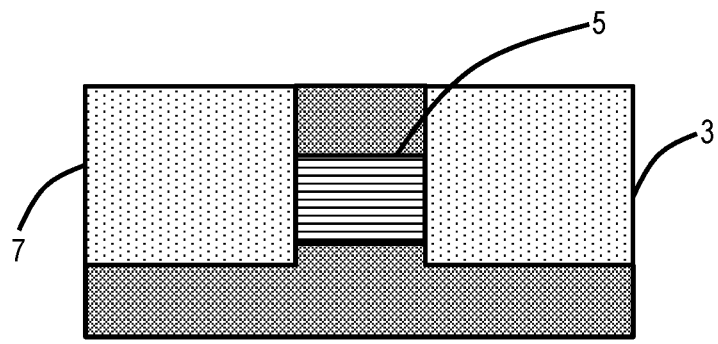
FIGS. 1A and 1B are a series of schematic diagrams illustrating conventional strongly-guided and weakly-guided (shallow ridge) waveguides, respectively.
Figure 1B:
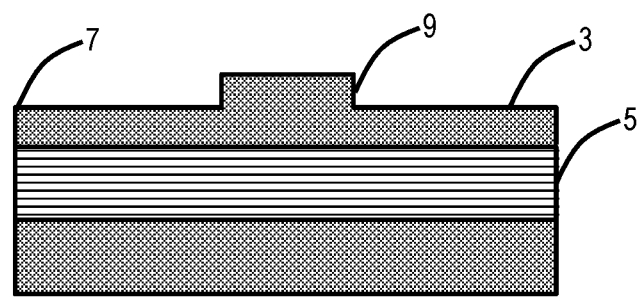
Figure 2A:
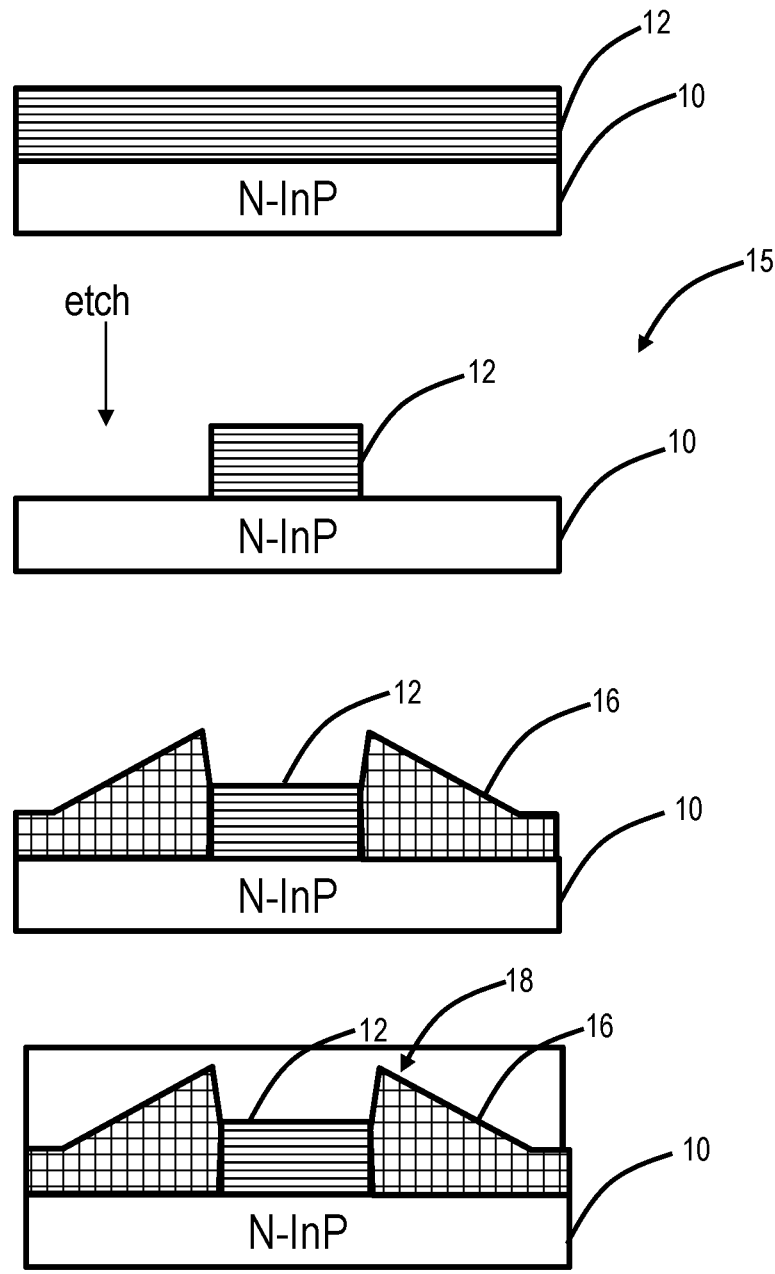
FIGS. 2A and 2B are a series of schematic diagrams illustrating the fabrication of conventional BH lasers or SOA structures.
Figure 2B:
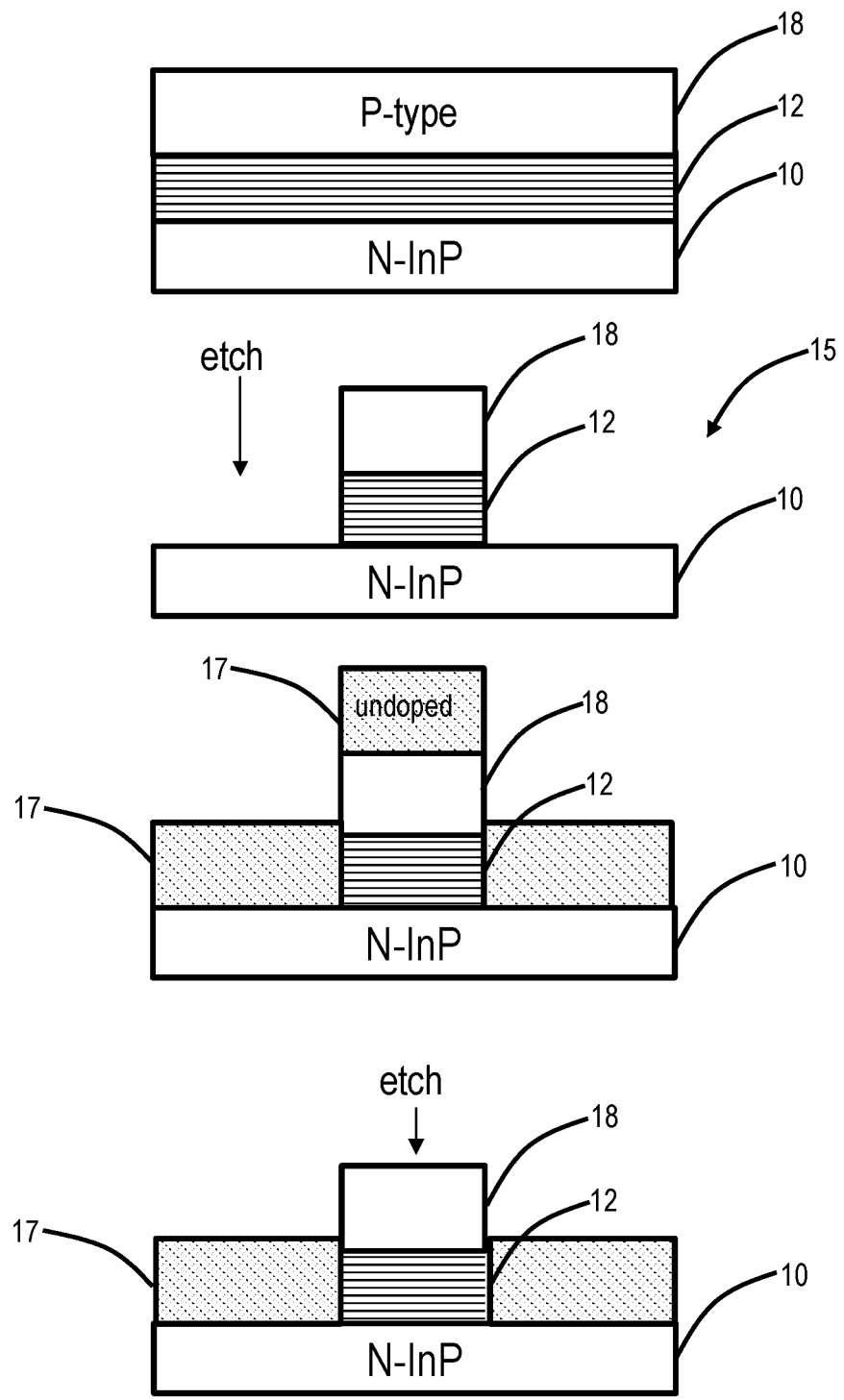
Figure 3:
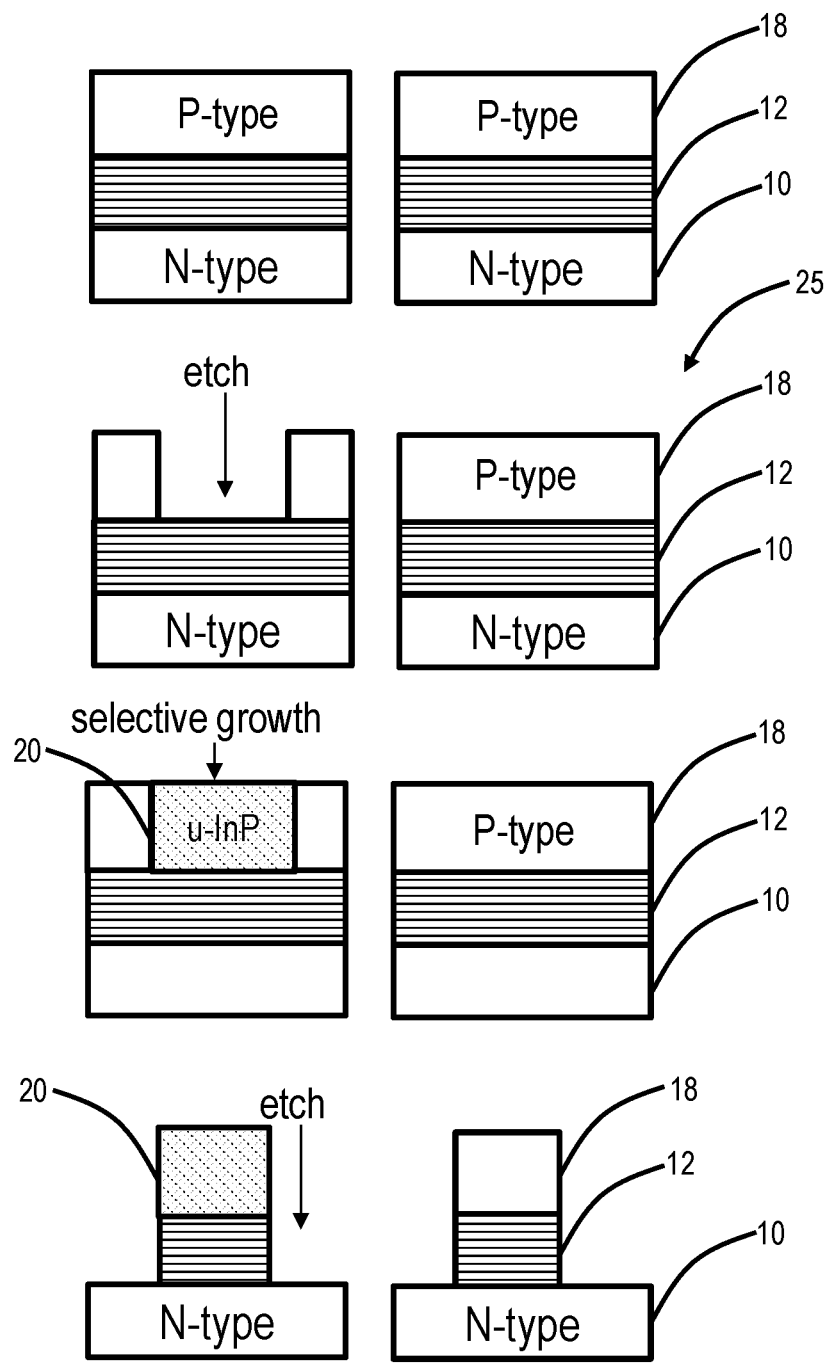
FIG. 3 is a series of schematic diagrams illustrating the fabrication of a conventional gain element.

FIG. 3 illustrates the fabrication of a conventional modulator structure 25, such as by the method provided in U.S. Pat. No. 9,182,546, for example. The modulator structure 25 is fabricated by blanketing the N-type substrate 10 with a first growth of MQW material 12 and a P-type layer 18. In a u-type ridge embodiment, a selective etch of the P-type layer 18 is then performed, and a u-InP layer 20 is selectively grown in the etched area. The P-type layer 18 and MQW material 12 are then selectively etched, leaving a u-InP-capped ridge in the u-type ridge SOA embodiment and a P-type-capped ridge in a P-type ridge modulator embodiment. Thus, a selective u-type growth step is typically utilized. It is still desirable to monolithically integrate a SOA with a modulator and provide performance that approximates that of a BH structure 15 (FIGS. 2A and 2B), without the introduction of a critically-aligned growth step. It is also still desirable to, for the monolithically integrated SOA, create a BH-like structure that has a lateral optical mode that is compatible for optical coupling to a deeply etched modulator ridge.

Figure 4:
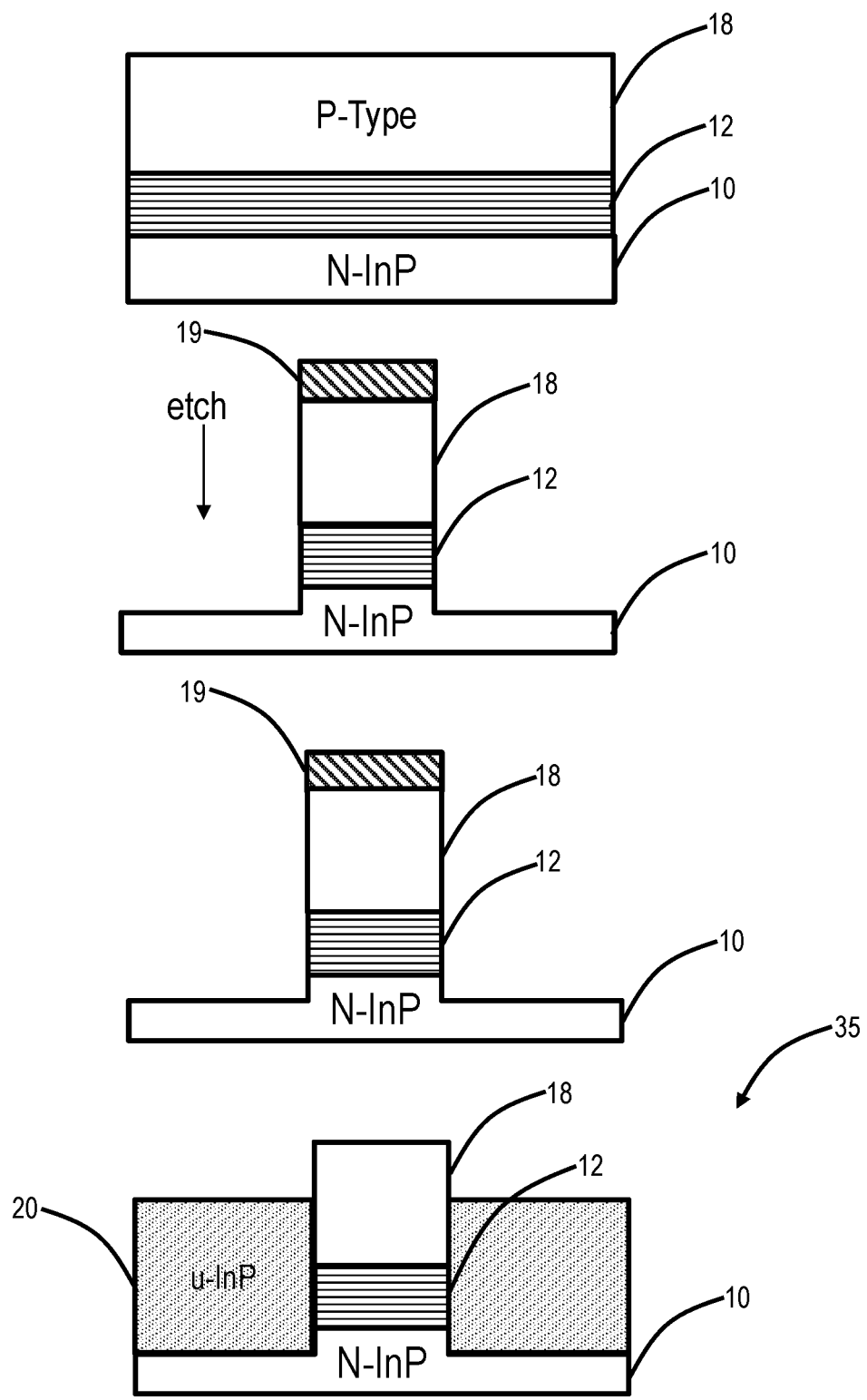
FIG. 4 is a series of schematic diagrams illustrating the fabrication of one exemplary embodiment of the gain element of the present disclosure.

Referring now specifically to FIG. 4, in one exemplary embodiment, the gain element structure 35 of the present disclosure is fabricated by blanketing an N-type layer 10 with a first growth of optical gain material 12 and a P-type layer 18. The P-type layer 18, optical gain material 12, and N-type layer 10 are then selectively etched, leaving a P-capped ridge that is covered with a mask 19. A u-type growth step is then utilized to fill the lateral areas of the ridge with u-InP material 20. Here, the lateral u-InP material 20 provides superior current blocking, without the extra growth steps and critical alignments associated with BH fabrication.

Figure 5:
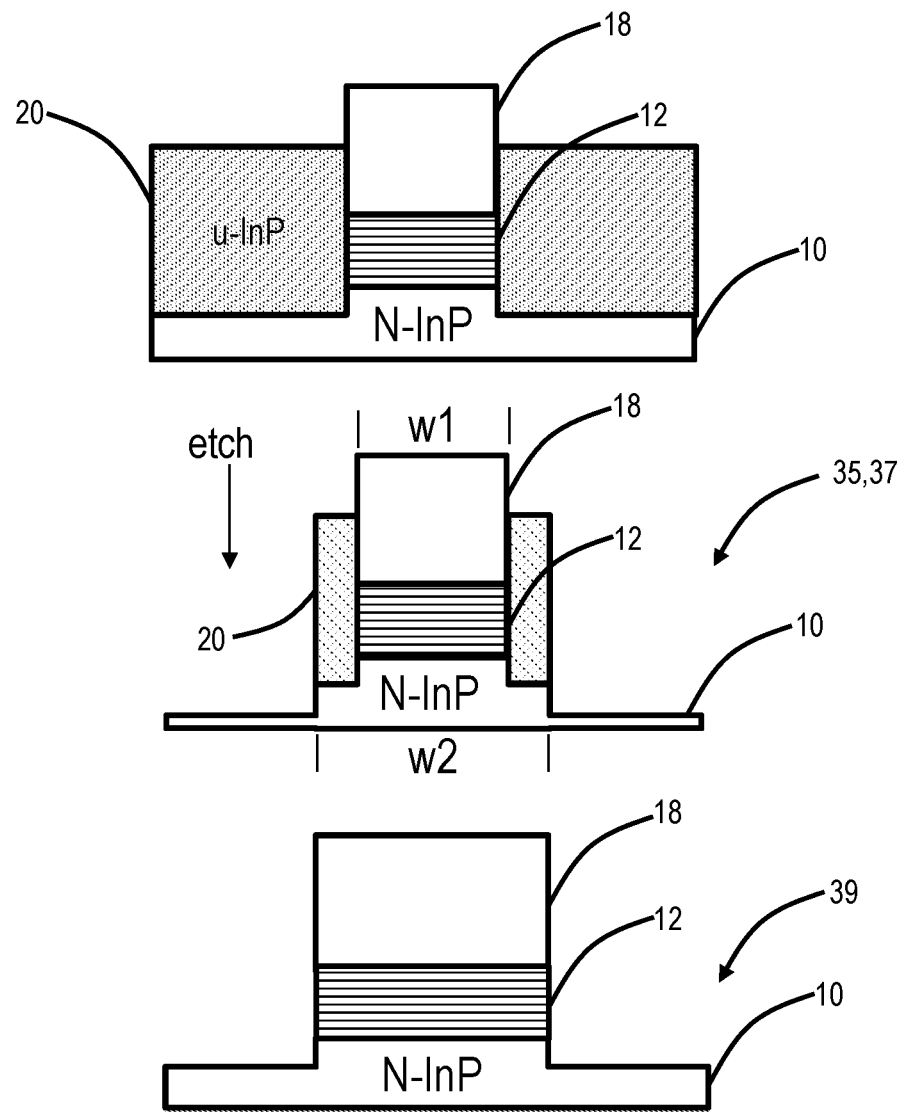
FIG. 5 is a series of schematic diagrams illustrating the fabrication of another exemplary embodiment of the gain element of the present disclosure, as well as the coupling of the associated SOA and modulator.

FIG. 5 is a series of schematic diagrams illustrating the fabrication of another exemplary embodiment of the gain element structure 35 of the present disclosure, as well as the means for coupling of the associated SOA 37 and modulator 39. The u-InP material 20 and N-type material 10 are etched to form u-InP material walls on either side of the ridge, thereby providing strong guiding on either side of the ridge. Further, the deeply etched modulator waveguide can be widened to provide lateral optical matching. It will be appreciated that, in FIG. 5, the bottom schematic represents the modulator waveguide that has been width-matched to the SOA input/output waveguide, shown in the middle schematic. For the SOA 37, W1 (current confinement) and W2 (optical mode overlap) can be varied independently, allowing the gain to be varied along the length of the SOA 37, for example to mitigate the effects of spatial hole burning.

Figure 6:
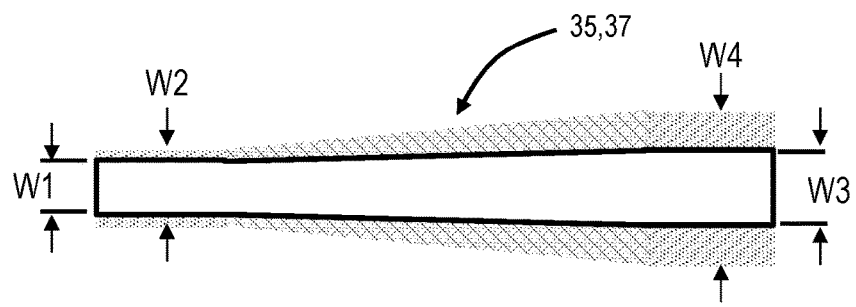
FIG. 6 is a schematic diagram illustrating the flaring of a waveguide SOA or modulator width to match an associated modulator SOA optical mode in accordance with the methods of the present disclosure.

FIG. 6 is a schematic diagram illustrating the flaring of a waveguide SOA or modulator width to match an associated modulator SOA optical mode in accordance with the methods of the present disclosure. Any arbitrary combination of central width and exterior width, with tapers in between, is possible. For example, only the central portion could be tapered, omitting the leading and trailing constant sections. This provides practical advantages for spatial hole burning by having high optical confinement at the beginning, and increasing injection, but lowering optical overlap at the end.

Figure 7:
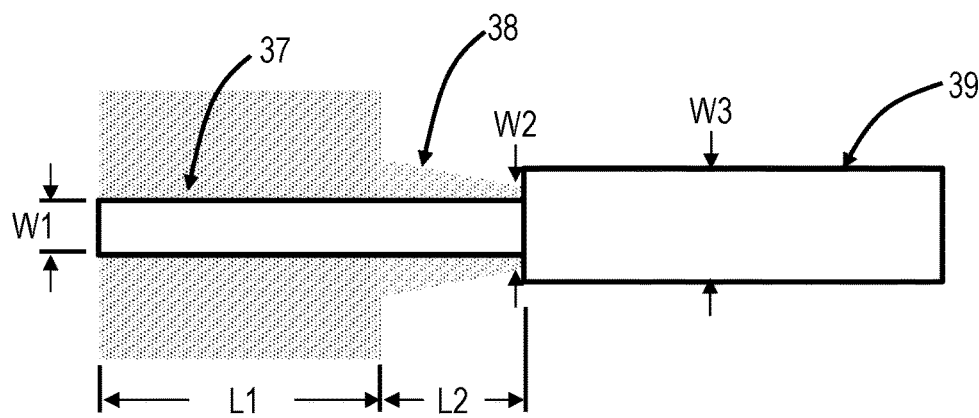
FIG. 7 is another schematic diagram illustrating the flaring of a waveguide modulator width to match an SOA optical mode in accordance with the methods of the present disclosure.

FIG. 7 is another schematic diagram illustrating the flaring of the waveguide modulator width to match the SOA optical mode in accordance with the methods of the present disclosure. Here, the SOA waveguide 37 is coupled to the modulator waveguide 39 via a tapering passive waveguide 38 or a tapering portion of the SOA waveguide 37 or modulator waveguide 39.

In the conventional modulator structure 25 of FIG. 3, there is already a selective growth of u-InP layer 20, the thickness of which may be determined by the optimization of the modulator design. This same growth is used herein to provide better current blocking for a SOA. As shown in FIG. 4, the u-InP layer 20 from the conventional modulator may also be deposited on either side of the SOA ridge 19. The design requirements of the modulator 25, however, may not provide a thickness of u-InP layer 20 sufficient to match the height of the SOA ridge 19. To improve the manufacturability of subsequent processing steps, enhanced growth may be used to make a more planar top surface. It should be noted that, for regions not requiring the increased lateral confinement of the current-blocking mesa, width can be increased so as to improve the thermal impedance of the SOA. For increased lateral optical confinement (to match the modulator mode and/or improve SOA efficiency), the deep etch ridge can be used.

Figure 8:
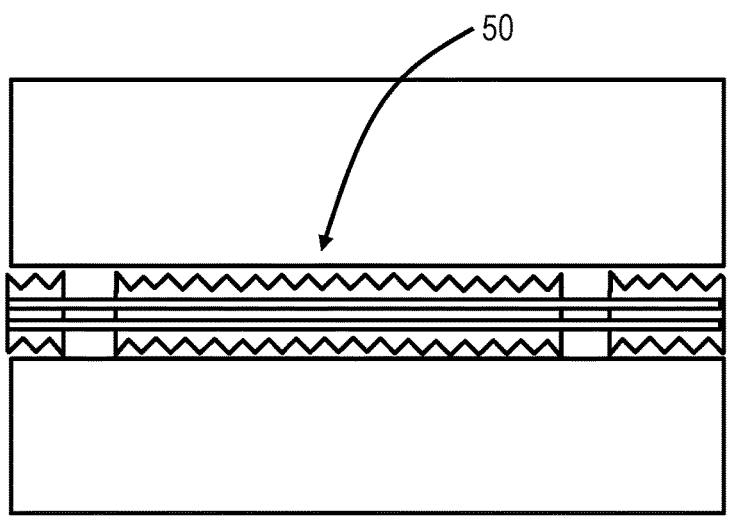
FIG. 8 is a schematic diagram illustrating a novel geometry for the edge of a mask used to overgrow an epitaxial layer in accordance with the methods of the present disclosure, suppressing undesirable growth enhancement.

By way of an enabling technology, FIG. 8 illustrates a novel geometry 50 for the edge of a mask used to overgrow an epitaxial layer. There is often an undesirable degree of enhanced crystal growth that occurs at the mask edge where the pattern is in the [011] or [0-11] directions, for example. The use of a non-linear geometry 50 for the mask edge suppresses this undesirable growth enhancement. The use of a zigzag pattern on the mask edge, rather than a straight edge, is a novel solution. Unintentional growth enhancement at a mask edge is an ongoing problem in selective area growth. Solutions to date have focused on altering the growth conditions for the epitaxial growth. Selective area epitaxy is a technique that is used in the production of many InP optical modulators. This technique and the use of mask patterns to reduce unintentional enhancement are related to multi-growth modulators on InP substrate as described in U.S. Pat. No. 9,182,546. Suppressing unintentional enhancement by changing growth conditions has the disadvantage of also suppressing the intentional growth enhancement, which is often the purpose of pursuing selective area growth in the first place. The conventional use of straight-sided selective area masks (SAMs) leads to linear structures of enhanced growth material along the mask edge that are fragile and break off to cause contamination of the device surface, which has an adverse effect on manufacturability and reliability. The use of a geometric solution 50 suppresses the intentional growth enhancement at the edge of the mask without compromising the intended growth enhancement. The effect of unintentional enhancement at a mask edge is anisotropic on the wafer surface. Along one directional axis, the effect is strong, but along the perpendicular axis it is weak. By placing a zigzag pattern 50 along the edge susceptible to enhancement, almost none of that boundary is parallel to the line along which the unintentional enhancement occurs.

Although the present disclosure is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following non-limiting claims for all purposes.

What is claimed is:

1. A photonic integrated circuit comprising a photonic device and a gain element, said gain element formed by a process comprising:
    depositing by epitaxy a first doped layer onto a substrate;
    depositing by epitaxy an active layer capable of optical gain onto the first doped layer;
    depositing by epitaxy a second doped layer onto the active layer;
    pattern etching at least the second doped layer and the active layer to form a first ridge;
    depositing by epitaxy a current blocking layer laterally adjacent to the first ridge and at least partially filling the volume of active layer that was removed by the pattern etching;
    providing a first waveguide having a first overall length and a first overall width, formed by a combination of the first ridge and an adjacent current blocking layer, that is constant or tapering; and
    providing a second waveguide having a second overall length and a second overall width that is constant or tapering contiguous with the first waveguide, formed by selectively etching the current blocking layer;
    wherein the first overall width is larger than the second overall width, and wherein the first waveguide is weakly guided and the second waveguide is strongly guided, and wherein the current blocking layer forms a portion of the photonic device.

2. The photonic integrated circuit of claim 1, wherein the second overall width tapers along the second length, providing a transition from weakly guided to strongly guided in the second waveguide.

3. The photonic integrated circuit of claim 1, further comprising a strongly-guided third waveguide contiguous with the second waveguide and having a third width, wherein the third width and second width are selected to provide optimal coupling of light between the second and third waveguides.

4. The photonic integrated circuit of claim 1, wherein the gain element is optically coupled to the photonic device.

5. The photonic integrated circuit of claim 1, wherein the photonic device is an optical modulator.

6. The photonic integrated circuit of claim 1, wherein the current blocking layer comprises an undoped semiconductor.

7. The photonic integrated circuit of claim 1, wherein the substrate comprises indium phosphide.

8. The photonic integrated circuit of claim 1, wherein any of the first doped layer, the second doped layer, and the current blocking layer is/are made substantially conducting or non-conducting via implanting ions.

9. The photonic integrated circuit of claim 1, wherein any of the first doped layer, the second doped layer, and the current blocking layer is/are made substantially conducting or non-conducting via diffusing dopants.

10. The photonic integrated circuit of claim 1, wherein the current blocking layer comprises multiple sub-layers, each with different dopants.

11. The photonic integrated circuit of claim 1, wherein the current blocking layer functions as an overclad layer in the photonic device.

12. The photonic integrated circuit of claim 1, wherein the current blocking layer comprises iron-doped indium phosphide.

13. A photonic integrated circuit comprising:
   a first doped layer on a substrate;
   an active layer capable of optical gain on the first doped layer;
   a second doped layer on the active layer;
   a first ridge patterned on at least the second doped layer and the active layer;
   a current blocking layer laterally adjacent to the first ridge and at least partially filling the volume of active layer of the first ridge,
   a first waveguide having a first overall length and a first overall width, that includes a combination of the first ridge and an adjacent current blocking layer, that is constant or tapering; and
   a second waveguide having a second overall length and a second overall width that is constant or tapering contiguous with the first waveguide, formed in the current blocking layer,
   wherein the first overall width is larger than the second overall width, and wherein the first waveguide is weakly guided and the second waveguide is strongly guided.

14. The photonic integrated circuit of claim 13, wherein the second overall width tapers along the second length, providing a transition from weakly guided to strongly guided in the second waveguide.

15. The photonic integrated circuit of claim 13, wherein the gain element is optically coupled to the photonic device.

16. The photonic integrated circuit of claim 15, further comprising a strongly-guided third waveguide contiguous with the second waveguide and having a third width, wherein the third width and second width are selected to provide optimal coupling of light between the second and third waveguides.

17. The photonic integrated circuit of claim 13, wherein the photonic device is an optical modulator.

18. The photonic integrated circuit of claim 13, wherein the current blocking layer comprises an undoped semiconductor.

19. The photonic integrated circuit of claim 13, wherein the substrate comprises indium phosphide.

* * * * *